United States Patent
Binder et al.

(10) Patent No.: US 9,527,725 B2
(45) Date of Patent: *Dec. 27, 2016

(54) SEMICONDUCTOR STRUCTURE WITH LAMELLA DEFINED BY SINGULATION TRENCH

(71) Applicant: Infineon Technologies AG, Neubiberg (DE)

(72) Inventors: Boris Binder, Dresden (DE); Bernd Foeste, Dresden (DE); Thoralf Kautzsch, Dresden (DE); Stefan Kolb, Unterschleissheim (DE); Marco Mueller, Pirna (DE)

(73) Assignee: Infineon Technologies AG, Neubiberg (DE)

( * ) Notice: Subject to any disclaimer, the term of this patent is extended or adjusted under 35 U.S.C. 154(b) by 72 days.

This patent is subject to a terminal disclaimer.

(21) Appl. No.: 14/254,388

(22) Filed: Apr. 16, 2014

(65) Prior Publication Data

US 2014/0227818 A1    Aug. 14, 2014

Related U.S. Application Data

(60) Division of application No. 12/898,221, filed on Oct. 5, 2010, now Pat. No. 8,723,276, which is a
(Continued)

(51) Int. Cl.
*H01L 29/84* (2006.01)
*B81C 1/00* (2006.01)
(Continued)

(52) U.S. Cl.
CPC .......... *B81C 1/0015* (2013.01); *G01L 9/0052* (2013.01); *G01L 9/0073* (2013.01); *G01L 9/0098* (2013.01); *G01L 13/025* (2013.01); *G01L 15/00* (2013.01)

(58) Field of Classification Search
None
See application file for complete search history.

(56) References Cited

U.S. PATENT DOCUMENTS 5,266,827 A    11/1993    Kato
5,343,064 A    8/1994    Spangler et al.
(Continued)

FOREIGN PATENT DOCUMENTS

CN    1808086 A    7/2006
DE    230079 A1    11/1985
WO    2008027143 A2    3/2008

OTHER PUBLICATIONS

Non-Final Office Action Dated Jan. 28, 2010 for U.S. Appl. No. 12/208,897. 12 Pages.
(Continued)

*Primary Examiner* — Daniel Whalen
(74) *Attorney, Agent, or Firm* — Eschweiler & Associates, LLC

(57) ABSTRACT

A method for fabricating a semiconductor structure includes etching a first opening into a substrate; etching a chip singulation trench into the substrate to define a lamella between the first opening and the chip singulation trench; fabricating a sense element for sensing a deflection of the lamella; and singulating the semiconductor structure at the chip singulation trench.

13 Claims, 14 Drawing Sheets

Related U.S. Application Data continuation-in-part of application No. 12/208,897, filed on Sep. 11, 2008, now Pat. No. 7,832,279.

(51) Int. Cl.
*G01L 9/00* (2006.01)
*G01L 13/02* (2006.01)
*G01L 15/00* (2006.01)

(56) References Cited

U.S. PATENT DOCUMENTS

| | | |
|---|---|---|
| 5,531,121 A | 7/1996 | Sparks et al. |
| 5,659,196 A | 8/1997 | Honda |
| 6,012,336 A | 1/2000 | Eaton et al. |
| 6,229,190 B1 | 5/2001 | Bryzek et al. |
| 6,331,470 B1 | 12/2001 | Sanfilippo et al. |
| 6,387,772 B1 * | 5/2002 | Chittipeddi ........... H01L 29/945 257/E21.396 |
| 6,704,185 B2 | 3/2004 | Chatzandroulis et al. |
| 6,939,474 B2 | 9/2005 | Eldridge et al. |
| 7,004,034 B2 | 2/2006 | Chen |
| 7,207,227 B2 | 4/2007 | Rangsten et al. |
| 7,329,933 B2 | 2/2008 | Zhe et al. |
| 7,402,449 B2 | 7/2008 | Fukuda et al. |
| 7,533,463 B2 | 5/2009 | Conta et al. |
| 7,555,956 B2 | 7/2009 | Benzel et al. |
| 7,799,588 B2 | 9/2010 | Oohara et al. |
| 7,832,279 B2 * | 11/2010 | Kautzsch ............... G01L 9/0052 73/754 |
| 7,874,333 B2 | 1/2011 | Durand |
| 8,471,346 B2 | 6/2013 | Kautzsch et al. |
| 2003/0068838 A1 | 4/2003 | Shie et al. |
| 2003/0192383 A1 | 10/2003 | Chen |
| 2004/0219705 A1 | 11/2004 | Corso |
| 2005/0202607 A1 | 9/2005 | Furukawa et al. |
| 2006/0001124 A1 | 1/2006 | Ayazi et al. |
| 2006/0093171 A1 | 5/2006 | Zhe et al. |
| 2007/0177287 A1 | 8/2007 | Oka et al. |
| 2008/0038921 A1 | 2/2008 | Gouda et al. |
| 2008/0128840 A1 | 6/2008 | Benzel |
| 2008/0178681 A1 | 7/2008 | Asada et al. |
| 2009/0072290 A1 * | 3/2009 | Cheng ................... H01L 21/84 257/303 |
| 2009/0266170 A1 | 10/2009 | Murashige et al. |
| 2010/0002543 A1 | 1/2010 | Schlosser et al. |
| 2010/0055821 A1 | 3/2010 | Buehler et al. |
| 2010/0058876 A1 | 3/2010 | Kautzsch et al. |
| 2011/0068420 A1 | 3/2011 | Binder et al. |
| 2011/0140216 A1 | 6/2011 | Qu |
| 2011/0163395 A1 | 7/2011 | Kautzsch et al. |
| 2011/0163398 A1 | 7/2011 | Laermer et al. |
| 2012/0068277 A1 | 3/2012 | Kautzsch et al. |
| 2013/0334624 A1 | 12/2013 | Kautzsch et al. |

OTHER PUBLICATIONS

Notice of Allowance Dated Jul. 13, 2010 for U.S. Appl. No. 12/208,897. 12 Pages.
Non-Final Office Action dated Jul. 19, 2012 in connection with U.S. Appl. No. 12/976,433.
U.S. Appl. No. 13/973,159, filed Aug. 22, 2013. 44 Pages.
Office Action dated Feb. 22, 2013 for U.S. Appl. No. 12/898,221.
Notice of Allowance dated Apr. 30, 2013 for U.S. Appl. No. 12/976,433.
Non-Final Office Action dated Oct. 7, 2013 in connection with U.S. Appl. No. 13/973,159.
Final Office Action dated Feb. 22, 2013 for U.S. Appl. No. 12/898,221.
Non-Final Office Action dated Sep. 6, 2013 for U.S. Appl. No. 12/898,221.
Notice of Allowance dated Jan. 6, 2014 for U.S. Appl. No. 12/898,221.
Notice of Allowance dated May 29, 2014 for U.S. Appl. No. 13/973,159.

* cited by examiner

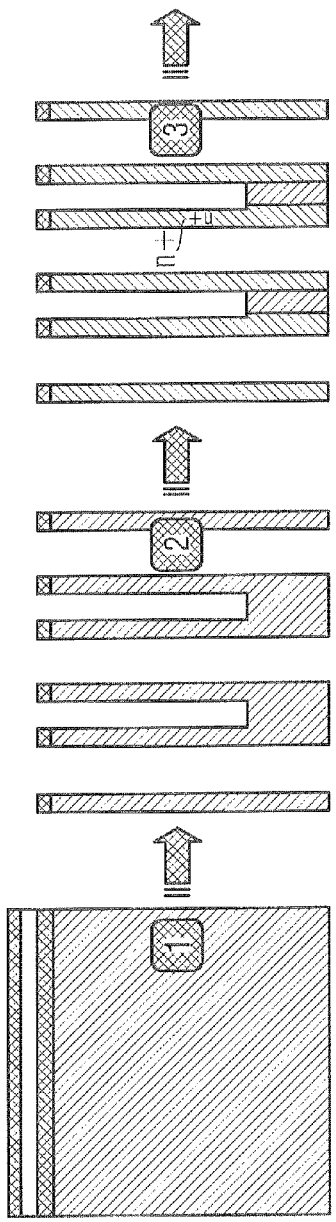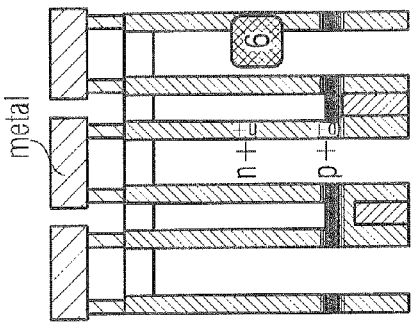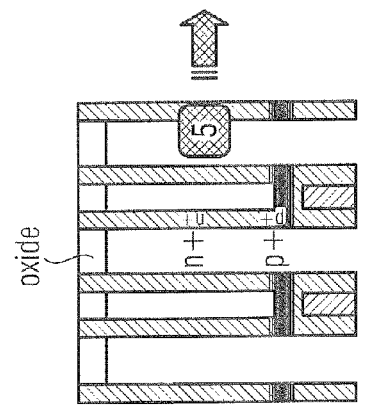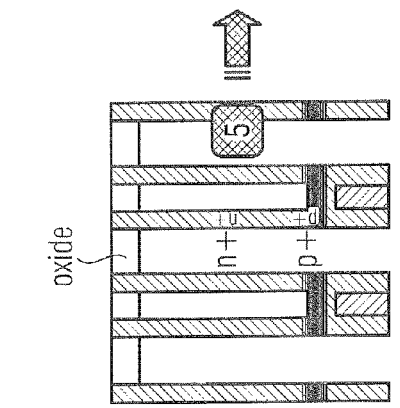
FIG 7A  FIG 7B  FIG 7C  FIG 7D  FIG 7E  FIG 7F

SEMICONDUCTOR STRUCTURE WITH LAMELLA DEFINED BY SINGULATION TRENCH

CROSS-REFERENCES TO RELATED APPLICATIONS

This application is a divisional of U.S. application Ser. No. 12/898,221 filed on Oct. 5, 2010, which is a continuation-in-part application of U.S. application Ser. No. 12/208,897 filed on Sep. 11, 2008 (issued on Nov. 16, 2010 as U.S. Pat. No. 7,832,279).

BACKGROUND

A number of applications in the field of micro-electronics require not only an electrical interaction with the environment but also some kind of mechanical, thermodynamic, fluid dynamic, chemical, radiation or other interaction with the environment. Examples of these applications can be found in the field of sensory devices, in the field of micro-electromechanical systems (MEMS), etc. A mechanical force, pressure, temperature, chemical substance, physical quantity etc. interacts with a dedicated portion of a semiconductor structure to produce a desired effect, e.g. a certain voltage or capacitance, which is a function of the applied physical quantity.

The example of a pressure sensor shall illustrate the technical context in a representative manner for types of applications requiring a similar interaction with the environment. Pressure sensors are typically used to measure the pressure of a liquid or a gas, such as air. Pressure sensors typically provide an output signal that varies based on the pressure sensed by the pressure sensor. One type of pressure sensor includes a stand alone pressure sensor that is coupled or bonded to a sensor surface, such as an application specific integrated circuit (ASIC). Another type of pressure sensor is a pressure capsule (e.g. a poly-silicon plate) that is integrated with a sensor circuit, such as an ASIC, during a back-end-of-line (BEOL) process. The pressure typically interacts with a lamella of the semiconductor structure that extends in a direction parallel to the main surfaces of a substrate of the semiconductor structure. The lamella is typically located in the vicinity of one of the main surfaces of the substrate. Thus, the main surface comprising the lamella needs to be positioned so that it is facing the volume the pressure of which is to be measured.

In alternative designs the lamella has been moved to the interior of the substrate. The pressure is typically conducted to the lamella by a pressure channel which may have a more or less complicated shape, depending on where the inlet of the pressure channel is positioned relative to the lamella.

SUMMARY

One embodiment of the invention addresses a method for fabricating a semiconductor structure, the method comprising: etching a first opening into a substrate; etching a chip singulation trench into the substrate to define a lamella between the first opening and the chip singulation trench; fabricating a sense element for sensing a deflection of the lamella; and singulating the semiconductor structure at the chip singulation trench.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of the embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 7A to 7F illustrate a process sequence for electrically insulating pressure sensitive structures.

DETAILED DESCRIPTION

In the following detailed description, reference is made to the accompanying drawings, which form a part hereof, and in which is shown by way of illustration specific embodiments in which the invention may be practiced. In this regard, directional terminology such a "top" and "bottom", "front" and "back", "leading", "trailing", etc., is used with reference to the orientation of the Figure(s) being described. As components of embodiments can be positioned in a number of different orientations, the directional terminology is used for purposes of illustration and is in no way limiting.

It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

At an earlier stage of the technical development process leading to the teachings disclosed herein, pressure sensors with a vertical design have been developed, i.e. the lamella extends in a direction substantially orthogonal to the main surfaces of the substrate. Other than a compact design, this concept also offers an option to provide differential pressure sensors having one or more very freely configurable pressure channel(s). With respect to applications in environments that are heavily polluted by liquids and the like, there may be a risk of the pressure channels and other structures of the pressure sensor becoming permanently congested—depending on the usage of the pressure sensor. As a result of the congestion, a change of the dielectric conditions between the pressure-sensitive plates to be read out and hence a change of the capacity signal may occur. It is imaginable that applications in a less polluted environment, having lower demands with respect to chemical inertness and less demanding specifications, can be served with the pressure sensors with vertical design. However, especially in the automotive field, the demands are typically tough (among others, the pressure sensor will be tested against different chemical substances with respect to their robustness). Possibly, meeting these high demands might be achievable with a skilled use of auxiliary layers that act in a liquid-repellent manner. It is, however, of great interest to provide alternative, robust solutions for these highly demanding applications, as well.

Figure 2:
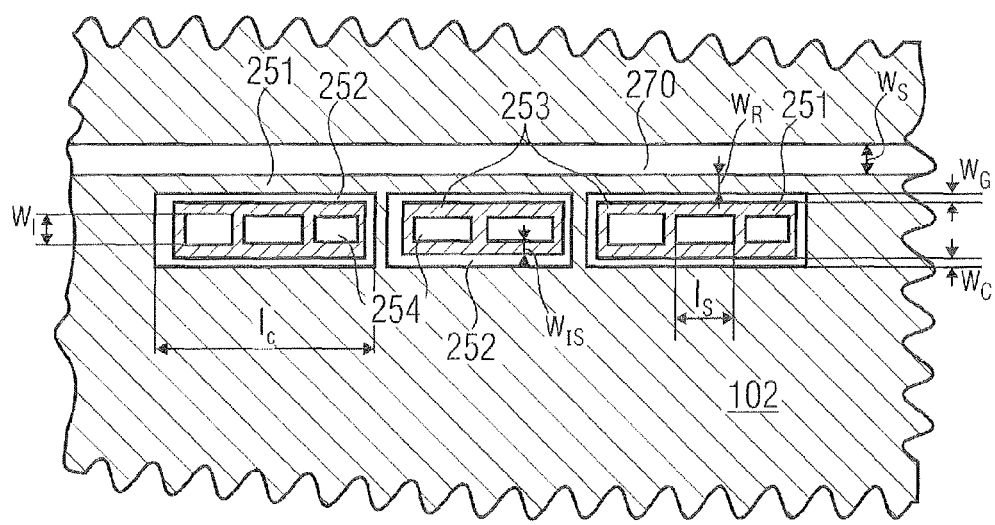
FIG. 2 illustrates a schematic horizontal cross section through a semiconductor structure according to teachings disclosed herein.
Figure 3:
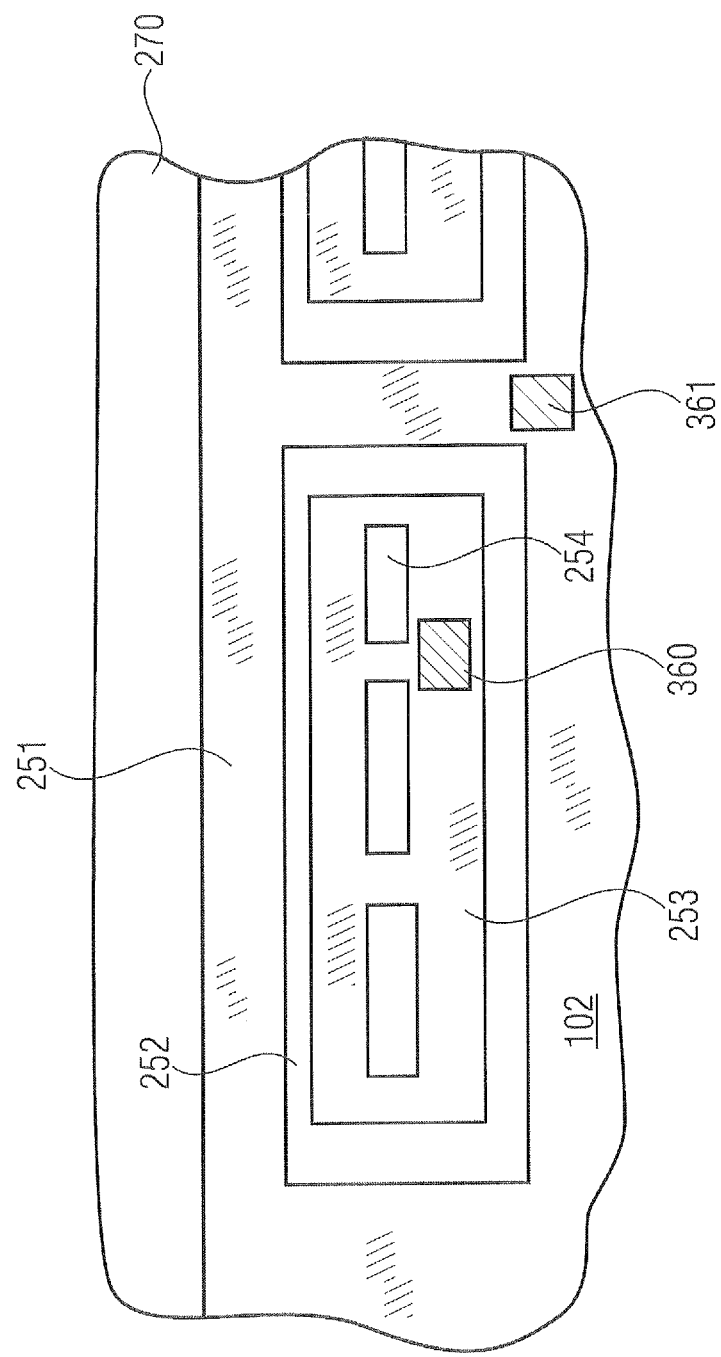
FIG. 3 illustrates a partial view of a schematic cross section of a semiconductor structure.

Some of the teachings disclosed herein propose to create the sensor element parallel to the chip edge so that a pressure channel may be dispensed with altogether. The FIGS. 1 to 3 illustrate corresponding sensor elements.

Figure 1:
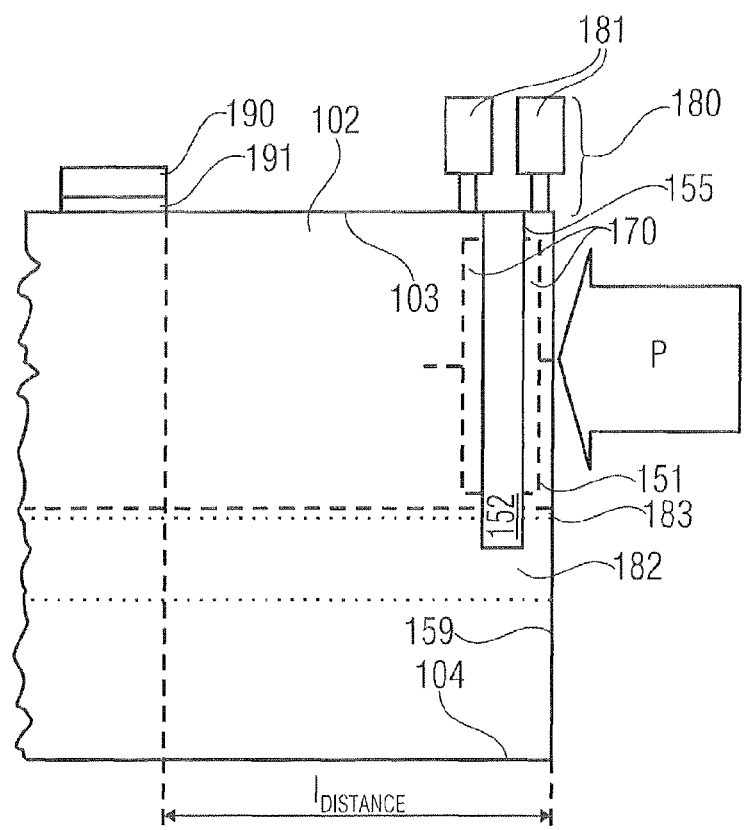
FIG. 1 illustrates a schematic vertical cross section through a semiconductor structure according to teachings disclosed herein.

FIG. 1 shows schematic vertical cross section through a semiconductor structure. A substrate 102 has a first main surface 103 and a second main surface 104. Furthermore, the substrate 102 has a cavity 152 formed therein. The cavity 152 is bounded at its left side by a wall of the substrate 102 and on the right side by a lamella 151 which is actually a portion of the substrate 102 and usually an integral part thereof. The lamella 151 is thin enough to be deflectable upon a solicitation with a pressure P (or another type of physical quantity, such as a force) applied to the lamella 151 from the exterior. At the top, the cavity 152 is closed by a cover material 155 and thus provides a reference pressure volume. The lamella 151 and the opposite wall of the substrate 102 form a capacitor which is represented as dashed lines in an illustrative manner by the two capacitor plates or plate regions 170. Due to the deflection of the lamella 151, the distance between the capacitor plates 170 varies as a function of the pressure P. A variation of the distance between the capacitor plates 170 leads to a variation of the capacitance of the capacitor. The lamella 151 is located close to a boundary of a chip on which the semiconductor structure is realized and is actually a part of a chip edge 159 of the semiconductor structure.

In the implementation shown in FIG. 1 the substrate 102 comprises several layers 182 and 183. These layers 182, 183 act as electrically insulating layers. For example, the layers 182 and 183 may be layers having opposite types of doping, e.g. layer 182 being a p+ type doped layer and layer 183 being a n+ type doped layer. The structure formed by the layers 182 and 183 creates a pn junction in the substrate. In the alternative, other types of rendering at least one of the layers 182, 183 electrically insulating may be used, such as implanting oxygen atoms in (one of) the layers 182, 183 and a subsequent annealing to create a silicon oxide. Note that a single one of the layers 182, 183 may be sufficient. The cavity 152 intersects at least one of the layers 182, 183. Thus, the lamella 151 is electrically insulated with respect to the remainder of the substrate 102 at the location where the lamella merges with the remainder of the substrate 102. Typically, the cavity 152 is also closed by walls located at the narrow sides, i.e. above and beneath the drawing plane (not illustrated in FIG. 1). These walls typically need to be electrically insulating, too, in order for the lamella 151 being completely electrically insulated from the remainder of the substrate 102. The cover material 155 is typically electrically insulating, as well.

Above the first main surface 103 of the substrate 102, connecting layers 180 are provided via which the electrodes of the capacitor formed by the lamella 151 and the opposite wall can be connected to an evaluating circuitry. The elements indicated by reference numeral 181 belong to one or more metal layers.

The semiconductor structure further comprises circuit layers 190, 191 such as used for implementing CMOS circuits. The circuit layers 190, 191 are located at a distance $I_{DISTANCE}$ from the chip edge 159. As an example, the distance $I_{DISTANCE}$ is in the range from approximately 1 μm to 5 μm, e.g. 2 μm, 3 μm, or 4 μm. The distance $I_{DISTANCE}$ could also be larger than 5 μm, for example 7 μm, 10 μm, or 12 μm. This distance $I_{DISTANCE}$ provides a margin to avoid damage of the potentially delicate circuit layers resulting from handling the chip at the chip edge, in particular performing a chip singulation at the chip edge. The elements 181 used for electrically connecting the capacitor plates 170 with the circuit layers 190, 191 (especially the one for connecting the lamella 151) may be designed to be sufficiently robust so as to withstand typical loads observed when handling the semiconductor structure.

The concept without a pressure channel is well adapted to be employed in a tough environment, as no cavity is directly exposed to the environment. In addition, the location where the exterior pressure is applied is provided at the chip edge, resulting in a more compact package compared to pressure sensors having the lamella extending in a direction parallel to the main surfaces of the substrate 102. Moreover, a pressure sensor comprising an upright lamella (i.e. perpendicular to the main surfaces) coinciding with an edge of a semiconductor chip typically can be produced at lower cost than the above mentioned devices having horizontal lamellae or pressure sensing elements.

A simple estimation of the total capacitance at one's disposal and the sensitivity associated that goes along shows that the depicted implementation is in the range of a current dimensioning. Depending on the width of the closed cavity 152, capacitance values can be achieved on the order of one to ten femtofarads (fF) per micrometer lamella length, i.e. the length of the chip edge 159 concerned, wherein the chip edge 159 belongs e.g. to an ASIC chip. A total length of the chip edge 159 being for example 2 mm, a total capacitance of 2 picofarads can be achieved. The absolute change of capacitance strongly depends on the dimensions of the lamella 151. At 10 μm lamella height and a lamella thickness between 200 nm and 300 nm, capacitance changes of up to 10% per 1 bar pressure change are achievable, that is, a few femtofarads. The total capacitance and sensitivities can be adjusted via selecting an etching depth and the lamella thickness. The dimensions of the lamella (thickness, length, height, etc.) and of the cavity (width, length, etc.) can be adjusted as well depending, for example, on the desired measurement range and sensitivity.

A further topic is chip singulation. It is possible to etch a significantly deeper trench at the same time a trench for the cavity is being etched. The significantly deeper trench borders the entire active chip area in a circumferential manner and specifies a breaking edge or chip edge. Several adjacent, contiguous chips can be singulated by means of technologies such as 'Stealth Dicing' or other suitable technologies. Depending on the design of the circumferential etch trench it may be possible to get by without auxiliary processes during chip singulation.

According to teachings disclosed herein, a pressure-sensitive (or force-sensitive, acceleration-sensitive, etc.) structure is located at the chip edge 159. The pressure-sensitive lamella 151 delimits the chip. The breaking edge or chip singulation edge may be defined via a circumferential, deeper trench.

FIG. 2 shows a schematic fragmentary top or plan view of a horizontal cross section of a semiconductor substrate according to some of the teachings disclosed herein. Several first cavities 252 are formed in the substrate 102. The cavities 252 are configured as circumferential trenches surrounding inner structures 253. The inner structures 253 are formed as flat tubes with inner reinforcing walls and lumens 254 in the embodiment shown in FIG. 2. In other embodiments, the inner structures may have different configurations. The first cavities 252 are delimited at one side by lamellae 251. The lamellae 251 separate the first cavities 252 from a chip singulation trench 270. The chip singulation trench 270 typically has a larger width and a larger depth than the first cavities 252.

The inner structures 253 and the substrate 102, in particular the lamellae 251, form capacitors. The lamellae act as first electrodes of the capacitors and the inner structures 253 act as second electrodes. In one embodiment the inner structures 253 are not centered with respect to their corresponding first cavity 252. A section of the circumferential first cavity 252 located between the inner structure 253 and the lamella 251 defines a capacitor gap and has a smaller width than the three other sections of the first cavity in one embodiment. The capacitance C of a plate capacitor can be approximated by the relation $C=\epsilon A/d$, where $\epsilon$ is the permittivity of the material between the plates, A is the area of the plates and d is the distance of the two plates from each other. Since the capacitance is inversely related to the distance d of the two plates, the narrow gap portion of the capacitor, i.e. the portion that is bounded by the lamella 251, makes the largest contribution to the capacitance. As mentioned above, the lamella 251 deflects upon being externally impinged by e.g. a pressure or a force. This leads to the gap between the lamella 251 and the inner structure 253 changing its width, which in turn leads to a change of the capacitance of the capacitor. The inner structure 253 remains relatively fixed during pressure changes, partly due to its shape and the reinforcement walls. The same basically holds for the part of the substrate 102 beneath the first cavities 252 ("beneath" referring to the direction relative to the drawing). Thus, only the lamella 251 undergoes a significant deflection or deformation during pressure changes.

FIG. 2 indicates a number of dimensions which may be adjusted to obtain a desired operating range and sensitivity. The following table indicates the symbol of a certain dimension as used in FIG. 2, its meaning, exemplary ranges, and exemplary values.

| Symbol in FIG. 2 | Meaning | Exemplary ranges | Exemplary value |
| --- | --- | --- | --- |
| $w_S$ | width of chip singulation trench 270 | 100 to 500 nm 250 to 350 nm | 300 nm |
| $w_L$ | thickness of lamella 251 | 100 to 500 nm 250 to 350 nm | 300 nm |
| $w_G$ | width of gap between lamella 251 and inner structure 253 | 50 to 250 nm 100 to 180 nm | 150 nm |
| $w_C$ | Width of circumferenrential trench at opposite side of gap | 100 to 500 nm 250 to 350 nm | 300 nm |
| $w_{IS}$ | thickness of walls of inner structure 253 | 200 to 600 nm 350 to 450 nm | 400 nm |
| $w_I$ | width of lumen within inner structure 253 | 100 to 300 nm 180 to 230 nm | 200 nm |
| $l_S$ | length of lumen within inner structure 253 | 1 to 30 µm 5 to 15 µm | 10 µm |
| $l_C$ | length of cavity 252 | 10 to 100 µm 45 to 55 µm | 50 µm |

FIG. 3 shows a detail of FIG. 2. Electrical contacting elements or means 360, 361 are provided to electrically connect the lamella 251 and the inner structure 253 with an evaluation circuitry, such as a capacitance measurement circuit (not shown). The electrical connecting elements or means 360, 361 may extend to the connecting layers 180 and the metallic layers 181 of FIG. 1, for example.

The electrical contacting elements or means 360, 361 are located at portions of the inner structure 253 and the substrate 102 that are at a certain distance from the chip singulation trench 270. In particular, the lamella 251 is not contacted directly by the electrical contacting element or means 361, but via an internal wall of the substrate 102, the internal wall separating two first cavities 252. The contacting element or means 360 for the inner structure is located at a section of the inner structure 253 opposite to the lamella 251 in one embodiment.

The method for fabricating a semiconductor structure as well as the semiconductor structure itself may be enhanced by some of the following aspects.

The etching of the first opening (the cavity) and the etching of the chip singulation trench may be performed concurrently. Typically, the same lithography step is used to define the first opening and the chip singulation trench. The chip singulation trench typically has a larger width than the first opening. Depending on the etch technology that is used, the width of a trench to be etched also affects the depth (large width results in greater depth, and vice versa).

The first opening may be in the form of a circumferential trench surrounding an inner structure. In order to electrically insulate the inner structure, it is sufficient to insulate the bottom or 'foot' of the inner structure. This may be achieved by means of an insulating layer present within the substrate at the desired depth. Providing insulating layers and/or materials between the sidewalls of the inner structure with respect to the substrate is not necessary in one embodiment, since the circumferential trench acts as an insulator.

The method may further comprise providing an electrical contact to the inner structure for electrically connecting the inner structure with the sense element.

The electrical contact may be located at a portion of the inner structure opposite to the chip singulation trench. This means that the electrical contact is located relatively far apart from the singulation trench which moves it out of a region that may be subject to mechanical stress, especially during the singulation process but also during an operation of the semiconductor structure, when e.g. a pressure impinges on a side of a semiconductor chip at a region close to the lamella and where the singulation trench used to be.

Prior to etching the first opening in the substrate the method may further comprise: creating an electrically insulating layer on a main surface of the substrate; and depositing an outer layer of substrate material on the electrically insulating layer. The depositing of the outer layer typically results in the substrate getting thicker. The etching of the first opening and the chip singulation trench may then be done from a surface of the outer layer and extend down to the electrically insulating layer, at least. These method steps may have a synergetic effect with other features disclosed herein, e.g. the inner structure surrounded by the circumferential trench.

The method may further comprise: applying a liner material to walls of the first opening; filling the first opening with polysilicon; and etching at least a part of the liner material thereby leaving a gap between the polysilicon and at least part of the walls of the first opening. These actions define an alternative option for insulating one of the electrodes of the capacitor with respect to the substrate. The liner material typically is an insulating material, such as an oxide liner. It may also be envisaged to apply several layers of different liner materials to the walls of the first opening, each layer having a certain desired effect. When the polysilicon is formed for example as a substantially elongated or flat structure, such as a lamella or sheet-like structure, the liner material may be removed (at least partially) at both main surfaces of the flat structure (which are typically distinct from the main surfaces of the substrate). Instead, the liner material is kept at the narrow sides or the edges. Thus, the substantially flat structure is connected to the substrate at the ends only, possibly also at some selected portions at the main surfaces, and typically at the bottom. This reduces a parasitic capacity between the polysilicon and the surrounding wall of the substrate in one embodiment.

At least one of the first opening and the lamella may have a tapered cross-section. In contrast with a rectangular or uniform cross section, a tapered cross section enables a large range of measurement of e.g. a pressure sensor while maintaining a high sensitivity in a portion of the measurement range, typically the range of small values. Thus, the tapered cross-section according to one embodiment provides a progressive behavior to a sensor structure.

According to some of the teachings disclosed herein, a semiconductor structure comprises: a first cavity within a semiconductor substrate; a chip singulation edge coinciding with a portion of a circumference of the semiconductor substrate, the chip singulation edge and the first cavity defining a lamella between them; and a sense element configured for sensing a deflection of the lamella.

The first cavity may comprise a circumferential trench surrounding an inner structure located within the first cavity.

The semiconductor structure may further comprise an electrical contact to the inner structure for electrically connecting the inner structure with the sense element.

The electrical contact may be located at a portion of the inner structure opposite to the singulation trench.

The inner structure may comprise an electrically insulating layer for insulating the inner structure with respect to a remainder of the substrate.

The semiconductor structure may further comprise: a polysilicon structure arranged within the first cavity; a liner material layer between the polysilicon structure and a wall of the first cavity; and a gap between the polysilicon structure and the wall of the first cavity where the liner material is not between the polysilicon structure and the wall of the first cavity.

At least one of the first cavity and the lamella may have a tapered cross section.

When focusing on the semiconductor structure with a circumferential trench, a method of providing such a semiconductor structure comprises forming a circumferential trench surrounding an inner structure in a substrate. At least one wall defined by the circumferential trench comprises a lamella. The method also comprises insulating the inner structure with respect to the substrate at a portion of the inner structure supporting the inner structure at the substrate. The provision of a circumferential trench around the inner structure reduces the regions where an electrical insulation needs to be provided between the inner structure and the substrate. The inner structure can then be used as an electrode of a capacitor, for example. The method typically results in a semiconductor structure comprising a semiconductor substrate and a first cavity within the semiconductor substrate, the first cavity comprising a circumferential trench surrounding an inner structure within the first cavity, the inner structure being electrically insulated relative to a side wall of the first cavity. The method may further comprise a fabrication of a sense element for sensing a deflection on the lamella and providing a connection between the inner structure and the sense element. The sense element may for example evaluate an instantaneous capacitance value between the inner structure and the substrate. Another type of sense element may be based on evaluating a piezo effect.

According to some teachings disclosed herein, a method for fabricating a semiconductor structure comprises: etching a first opening into a substrate; etching a second opening into the substrate to define a lamella between the first opening and the second opening; fabricating a sense element for sensing a deflection on the lamella; and closing at least one of the first opening and the second opening. At least one of the first cavity and the lamella has a tapered cross-section. Accordingly, a resulting semiconductor comprises a first cavity within a semiconductor substrate; a second cavity within the semiconductor substrate, the second cavity being open to an atmosphere and defining a first lamella between the first cavity and the second cavity; and a sense element configured for sensing a deflection on the first lamella. Again, at least one of the first cavity and the lamella has a tapered cross-section.

According to some teachings disclosed herein, a method for fabricating a semiconductor structure comprises: etching a first opening into a substrate; applying a liner material to walls of the first opening; filling the first opening with polysilicon; etching at least a part of the liner material leaving a gap between the polysilicon and at least part of the walls of the first opening. Optional aspects of this method include:

The method may further comprise: etching a second opening into the substrate; sealing the first opening and second opening with a sealing material subsequent to the applying of the liner material; and removing at least a part of the sealing material of the first opening to facilitate or enable the etching of at least the part of the liner material.

The method may further comprise removing at least a part of the sealing material of the second opening subsequent to the etching of the liner material.

The method may further comprise performing a polysilicon recess subsequent to the filling of the first opening with polysilicon.

The method based on filling one or more trenches with polysilicon enables the resulting semiconductor structure to be inline-tested by means of e.g. a C(V)-measurement (capacitance-over-voltage). Furthermore, the polysilicon structure forms one of two or more capacitor electrodes and is insulated against the structure by the liner material, provided the liner material is an insulating material.

The resulting semiconductor structure comprises a first cavity within a semiconductor substrate; a polysilicon structure arranged within the first cavity; a liner material layer between the polysilicon structure and at least part of a wall of the first cavity; and a gap between the polysilicon structure and the wall of the first cavity where the liner material is not between the polysilicon structure and the wall of the first cavity. Optional aspects include:

a second cavity; a deflectable lamella between the first cavity and the second cavity; and a sense element for sensing a deflection of the lamella.

a sealing material for sealing the first cavity.

The liner material may be present between a portion of the wall of the first cavity and the polysilicon for supporting and electrically insulating the polysilicon from the substrate.

The portion of the wall where the liner material is present may be opposite to the gap.

The present disclosure also teaches a method for fabricating a semiconductor structure, the method comprising: creating an electrically insulating layer at a first main surface of a semiconductor substrate; providing semiconductor material on the electrically insulating layer; etching a first opening into the provided semiconductor material and the semiconductor substrate; and etching a second opening into the provided semiconductor material and the semiconductor substrate to define a lamella between the first opening and the second opening. The method may further comprise: fabricating a sense element for sensing a deflection on the lamella. The two etching actions may be performed during a single step of the process. The semiconductor substrate may be doped with a first doping type. The creation of the electrically insulating layer may then comprise a doping of the first main surface of the semiconductor substrate with a second doping type. Another option is to implant or otherwise inject e.g. oxygen atoms at the first main surface of the semiconductor substrate and to perform an annealing step to create a layer of oxide at the first main surface of the semiconductor substrate. The provision of the supplementary semiconductor material may be achieved by an epitaxy process or a Venezia-process.

A corresponding semiconductor structure comprises: a semiconductor substrate comprising a base substrate, a deposited or supplementary (top) layer, and an electrically insulating layer between the base substrate and the deposited (or supplementary) layer. A first cavity is disposed within the deposited (or supplementary) layer, the electrically insulating layer, and the base substrate; and a second cavity is disposed within the deposited (or supplementary) layer, wherein the second cavity is open to an atmosphere and defines a first lamella between the first cavity and the second cavity, the first lamella intersecting the electrically insulating layer. The semiconductor may also comprise a sense element configured for sensing a deflection of the first lamella. The base substrate and the deposited (supplementary) layer may be of a first doping type and the electrically insulating layer may be of a second doping type, the second doping type being opposite in polarity to the first doping type. As in the context of the method, the electrically insulating layer may have been obtained by means of an annealing process.

Figure 4A:
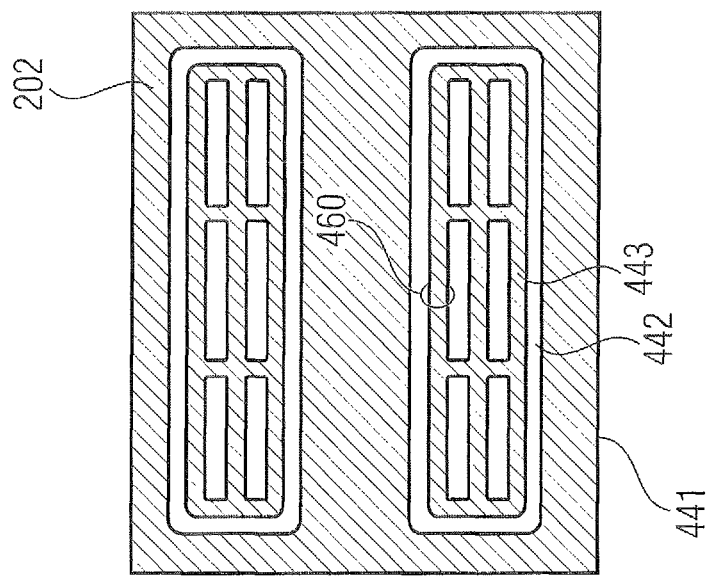
FIGS. 4A and 4B illustrate horizontal cross sections through cavities and two variants of inner structures within the cavities.
Figure 4B:
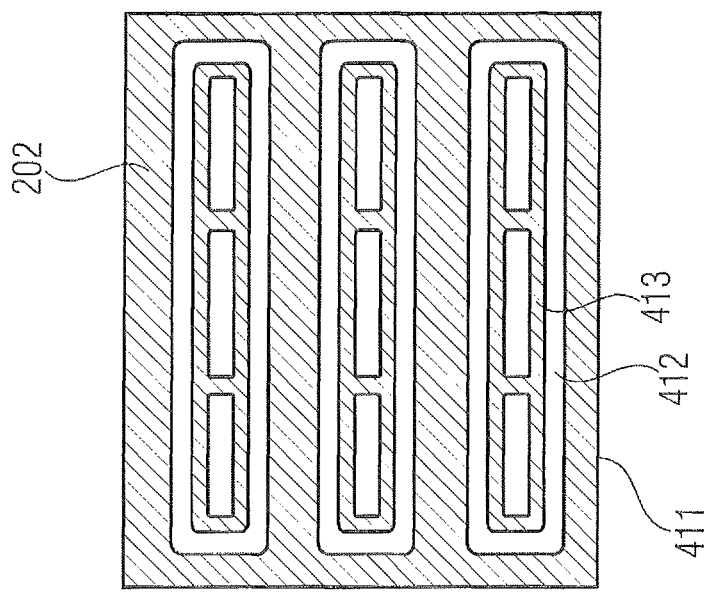

FIGS. 4A and 4B illustrate a top or plan view of cross-sections through cavities where the section plane is substantially parallel to the main surfaces 103, 104, 203, 204 of the substrate 102, 202. Referring to FIG. 4A, the substrate 202 comprises three similar cavities or trenches 412. The cavities 412 are in the form of circumferential cavities surrounding an inner structure 413. The inner structure 413 may be connected to the substrate 202 at a place above and/or beneath the drawing plane. Sidewalls of the inner structure 413 which are represented by means of their cross-sections in FIGS. 4A and 4B are typically not in contact with the sidewalls of the cavity 412, as can be seen in FIGS. 4A and 4B. Therefore, the inner structure 413 may be regarded as substantially free standing within the cavity 412. For the purposes of this disclosure, the expression "free standing" may comprise an inner structure 413 that is connected to the substrate 202 at two of its extremities, typically the top and the bottom extremities. The expression "free standing" also encompasses inner structures 413 that are connected to the substrate 202 at a single extremity, regardless of a spatial relation of the connection between the inner structure 413 and the substrate 202 (of top, bottom, or side).

FIG. 4B resembles FIG. 4A, but the cavity 442 is larger than the cavity 412. Also the inner structure 443 is larger than the inner structure 413 and has a different configuration.

In both, FIGS. 4A and 4B the inner structures 413, 443 are configured as tubes having reinforcement members to improve the stability of the inner structures 413, 443. Especially when the inner structures 413, 443 are connected at a single one of its extremities to the substrate 202, a sufficient stability of the inner structure 413, 443 is advantageous. The configuration as a tube with reinforcement members or reinforcement walls is capable of providing the required level of stability.

The inner structures 413, 443 may be used as one of the electrodes of e.g. a capacitor. Referring to FIG. 4A, the lower cavity 412 of the three illustrated cavities may be adjacent to a sidewall or a lamella 411. The lamella 411 may deflect as a function of a pressure difference between the cavity 412 and a volume on the other side of the lamella 411. As a consequence, the gap between the lamella 411 and the inner structure 413 changes its width leading to a variation in the capacitance of a capacitor formed by the lamella 411 and the inner structure 413. As the inner structure 413 is relatively stable and/or rigid, neither the pressure difference nor the deflection of the lamella 411 causes the inner structure 413 to move in a significant manner. When the inner structure 413, 443 is used as an electrode of a capacitor or the like, it is typically necessary to provide an electrical connection element or means 460 (represented schematically as the location where the electrical connection is situated) between the inner structures 413, 443 and some sort of evaluation circuitry. The lamella 411, 441 is typically close to a large cavity 220, or even an edge of a semiconductor chip. The substrate 202 is relatively delicate in the vicinity of the large cavity or the chip edge; i.e., the substrate may have reduced rigidity in this region. Therefore, it may be advantageous to position the electrical connection element or means 460 at some distance from the lamella 411, 441. Especially with the inner structure 434 shown in FIG. 4B, the electrical connection element or means 460 can be provided sufficiently far away from the lamella 441, as the inner structure 443 is relatively large. For example, the electrical connection means may be provided at the position indicated by the circle in FIG. 4B.

Figure 5:
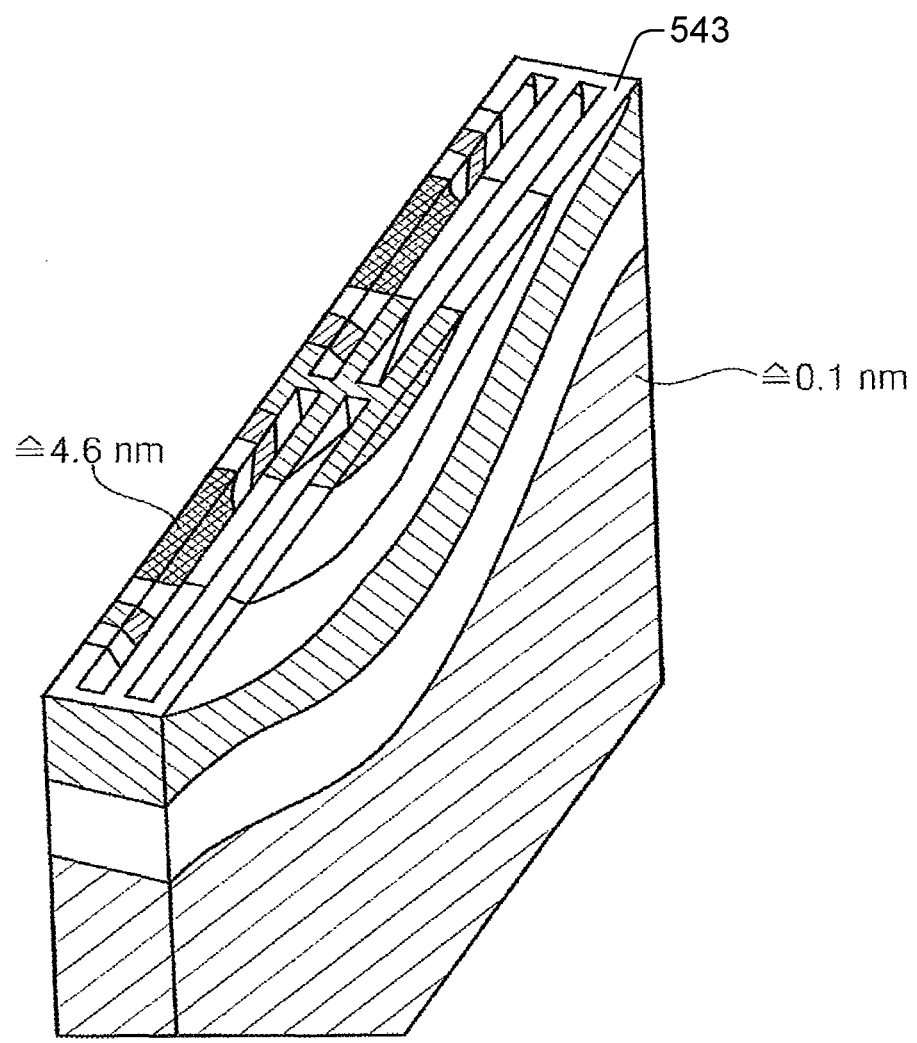
FIG. 5 illustrates a perspective view of a variant of an inner structure.

FIG. 5 shows a perspective view of an embodiment of an inner structure 543 similar to the inner structure 443 shown in FIG. 4B. As an alternative to the above mentioned utilization as a relatively rigid structure, the inner structure 543 shown in FIG. 5 could also be configured to provide the deflecting portion(s) at the sidewalls of the inner structure 543. To illustrate this, FIG. 5 shows by how much various portions of the inner structure deflect upon solicitation with a pressure (or pressure difference) of 1 bar. FIG. 5 shows the result of a finite element model (FEM) simulation. The minimum deflection calculated by the FEM simulation is 0.1 nm (indicated by a wide hatching in the drawing), the maximum deflection is 4.6 nm (indicated by a cross hatching). Intermediate levels of deflection are indicated, usually in an alternating manner, by non-hatched areas or different narrowly hatched areas. In these areas deflection values can be observed depending on their distance to the minimum deflection area(s) and the maximum deflection area(s). The inner structures shown in FIGS. 4A, 4B, and 5 are configured such that they provide a sufficient process capability via a sufficient rigidity. During an operation at a later time a sufficiently large deflection occurs at the long sections of the lamellae, as can be seen at the section illustrated in cross hatch, where a deflection of 4.6 nm has been predicted by the FEM simulation. A sufficiently large deflection ensures a desired level of sensitivity. Note that the inner structure 543 is not necessarily open at its upper end, as it is illustrated in FIG. 5. It is equally possible that the inner structure 543 is closed at its upper end so that four closed cavities (or any other number of closed cavities) are formed. The closed cavity may then assume the role of a pressure reference volume, while the pressure to be measured is applied from the circumferential trench surrounding the inner structure 543. It is also possible that the circumferential trench represents the reference volume and is therefore closed by a cover material. The pressure to be measured is then applied to the four or more cavities acting as pressure channels.

Figures 6A, 6B:
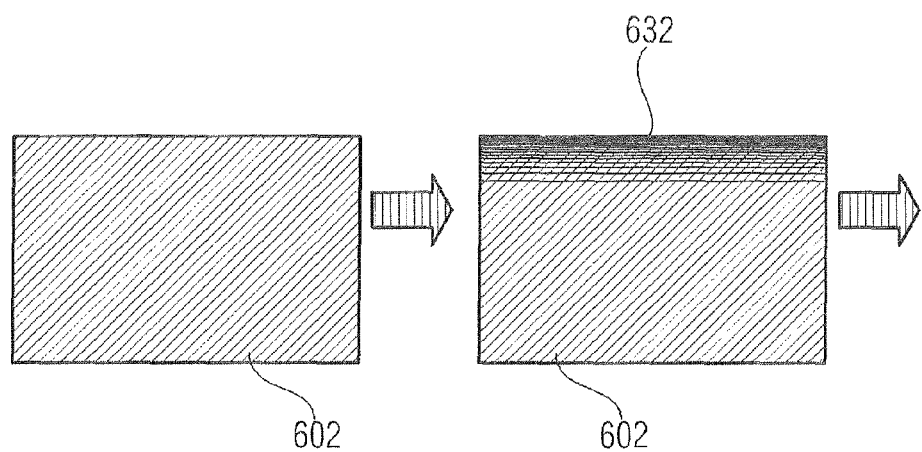
FIGS. 6A to 6D illustrate various stages of a depositing process and a subsequent etching of a semiconductor substrate.
Figures 6C, 6D:
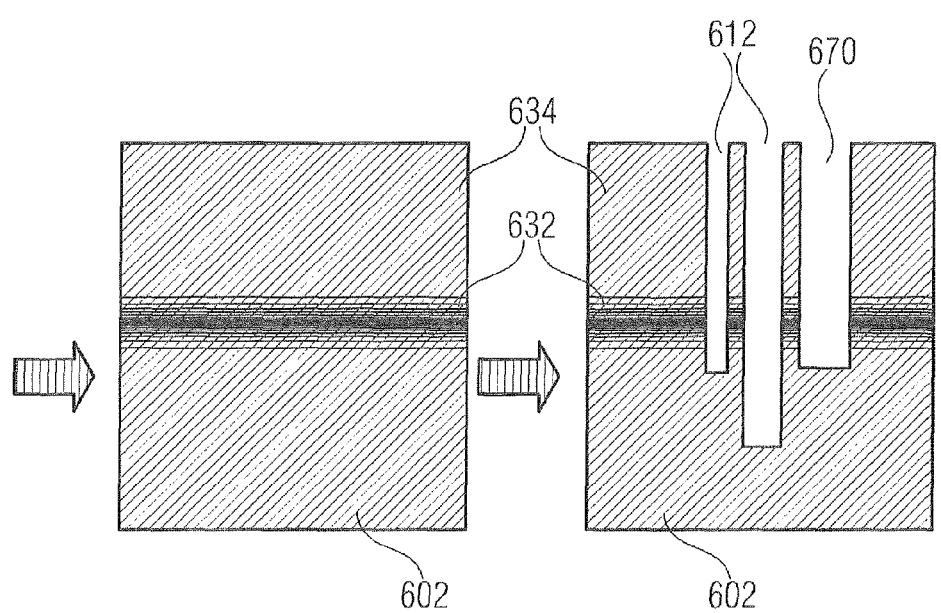

FIGS. 6A to 6D show four stages of a process by which an electrically insulating layer can be provided in a semiconductor substrate 602. The substrate 602 is typically a semiconductor material with a basic doping of a first polarity, e.g. n⁻ or p⁻. In a first step, the substrate 602 is doped with an opposite polarity at a surface to create an oppositely doped layer 632. Subsequently, an epitaxy or a Venezia-process is performed to build up a layer 634 on top of the oppositely doped layer 632. FIG. 6D shows how a plurality of trenches 612, 670 has been etched into the layer 634, the oppositely doped layer 632, and the (original) substrate 602. At the oppositely doped layer 632 two pn junctions will be formed, one of which is typically in reverse mode when a voltage is applied between for example, the upper and lower main surfaces of the substrate 602. Due to one of the two pn junctions being in reverse mode, the oppositely doped layer 632 acts as an insulator. On the other hand, the substrate 602 consists of a homogeneous material. The oppositely doped layer 632 may have different electrical properties compared to the rest of the substrate 602, but its chemical properties are substantially identical. Therefore, the plurality of trenches 612 can be etched through all three layers 634, 632, and 602 in substantially the same manner, for example, by means of a DT etching process.

The process illustrated in FIGS. 6A to 6D may be performed prior to the methods illustrated in FIGS. 1, 2A, and 2B. The process shown in FIGS. 6A to 6D may also be combined with the arrangement of circumferential cavities and inner structures shown in FIGS. 4A, 4B, and 5. Referring to FIG. 6D, it can be seen that the thin walls comprise portions that are electrically insulated from the lower part of the substrate 602 by means of the oppositely doped layers 632. Especially when the trenches are formed as circumferential trenches, as shown in FIG. 4A, the inner structure is completely electrically insulated from the lower part of the substrate 602 exclusively by the oppositely doped layer 632. Hence, no additional measures need to be undertaken in order to achieve an electrical insulation of the inner structure 413 (FIG. 4A).

Figure 8:
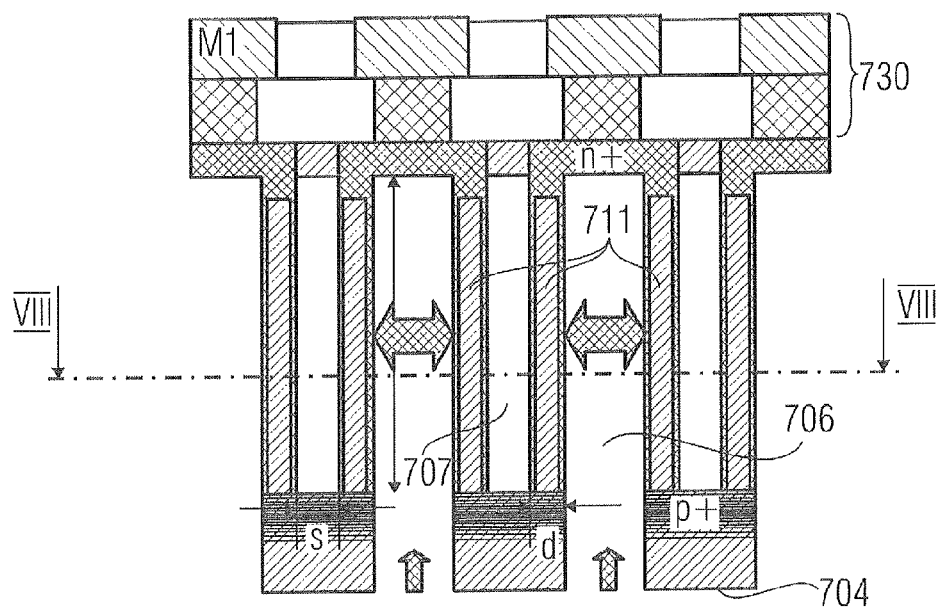
FIG. 8 illustrates a sensor structure implemented using a semiconductor structure.

Pressure sensors with a vertical configuration formed in a semiconductor substrate (as depicted in FIG. 8 and explained below) have been developed by the inventors in the past. With some of these pressure sensors, it poses a challenge to apply a doping in trenches having extreme aspect ratios, the doping providing for an electrical insulation of the pressure sensitive lamellae. Furthermore, a lateral doping of opposite polarity needs to be provided at the ends of the trenches. If possible, the process sequence employed to this end should be mask-free and robust.

One proposal comprises lamella doping by means of an arsenic glass coating and, subsequently, to provide the electrical insulation of the lamellae at the bottom and the sides by means of two angled boron implantations. A process sequence for electrically insulating the pressure sensitive structures is illustrated in FIGS. 7A to 7F and comprises the following steps:

depositing the hard mask heap for trench etching (FIG. 7A)

trench etching and hard mask heap removal (nitride layer stays at the surface and blocks the future arsenic glass coating and the boron implantation at the affected locations) (FIG. 7B)

arsenic glass coating and driving in of the arsenic (FIG. 7C)

boron implantation and activation of the boron (FIG. 7D)

depositing oxynitride (thin pad oxide beneath), recess of oxynitride (the superficial nitride is removed at the same time) (FIG. 7E)

metallization (FIG. 7F)

In FIG. 7D a boron implantation at an angle of 45 degrees with respect to the drawing plane and a second boron implantation rotated by 180 degrees are provided in order to concurrently ensure the doping of opposite polarity for the bottom (layer at the height indicated by "p+") and at the trench end. Typical accuracies of adjustment within implantation equipment are around 1 degree. Depending on the aspect ratio of the trench, higher accuracies are required so that, for example, implantation was performed several times in order to make a hit. This may result in a relatively large variance of the implanted dose. Even though multiple implantations were performed, it is challenging to achieve a sufficiently high doping of opposing polarity in order to isolate the lamellae.

According to teachings disclosed herein, a combination of structural modifications and a modified scheme of integration, or a new doping sequence for electrically insulating the structure, is proposed. First, the pressure sensitive structures are adapted in a manner that an insulation at the lamella end may be omitted, the result of which can be seen in FIGS. 4A, 4B, and 5, for example. An angled implantation for doping the lamella ends is not required anymore. It is sufficient to dope the inner structure(s) at the bottom of the trench for completely insulating the pressure lamellae from the substrate. This introduces new integrating options. A simple variant is an epitaxy of the substrate in a manner that the doping of opposing polarity on the wafer may be manufactured even before the etching of the trenches. The sequence is sketched in FIGS. 6A to 6D, for example.

The implanted dose can be controlled relatively precisely and a sufficiently high doping can be achieved with a few implantations, or even a single implantation.

The teachings disclosed herein may be combined with, or realized by, a silicon on insulator (SOI) technology. This technology refers to the use of a layered silicon-insulator-silicon substrate in place of conventional silicon substrates in semiconductor manufacturing, especially microelectronics, to reduce parasitic device capacitance and thereby improve performance. The insulator is typically silicon dioxide or sometimes sapphire. Instead of the doping performed e.g. prior to FIG. 6B, the insulator layer of a SOI structure may be applied or created by processes known in the field of SOI technology.

A non-angled implantation into the bottom of the trench is also conceivable in one embodiment. This typically results in a simpler process compared to the angled implantation. Depending on the depth of the structures an ultrahigh energy implantation is also possible—with a high temperature annealing step, which disperses the doping elements sufficiently and activates them (e.g., 3 MeV phosphor and 240 minutes at 1200 degrees Celsius). The latter combination would be slightly cheaper than a sequence with an epitaxy step as proposed above.

FIG. 8 illustrates a cross-section through a semiconductor structure used as a pressure sensor. The cavity 706 is a pressure channel and the cavity 707 is a pressure chamber serving as a reference for the pressure measurement. A lamella 711 is provided between the pressure channel 706 and the pressure camber 707. The two lamellae 711 enclosing the pressure chamber 707 are capable of deflecting under the influence of a pressure difference between the pressure channel 706 and the pressure chamber 707. The left lamella forms a first electrode of a capacitor, the right lamella 711 forms a second electrode of the capacitor, and the pressure chamber 707 forms the gap of the capacitor. In order to be electrically conductive, each one of the two lamellae 711 acting as a capacitor electrode is n+ doped, at least at the surface of the lamella. The two electrodes are electrically connected to an evaluation circuitry provided in one or more layers 730. The structure shown in FIG. 8 also has a second main surface 704 to which the pressure channels 706 are open. The width of the gap of the capacitor is indicated by the letter s, while the width of the lamella 711 is indicated by the letter w in FIG. 8. In order to electrically insulate the lamellae 711 with respect to each other at their lower ends, the $p^+$ doped section is provided, which acts as an insulating layer in a manner similar to the one described with regard to FIGS. 6A to 6D.

The construction of pressure sensors (either standalone or integrated into an ASIC) is typically quite similar among currently available models: a cavity is limited unilaterally or multilaterally by a lamella. The lamella is exposed to external media so that it deflects upon an external pressure change. This mechanical information is then transduced to an electrical signal by means of a piezo-resistive, capacitors or other suitable methods and further processes.

In the case of a capacitive information transduction, the lamella forms a capacitor with a sidewall of the cavity opposing the lamella. In order to achieve a high sensitivity of this arrangement, the lamella needs to be thinned and the cavity needs to be narrow. In this manner, a large change of the electrode distance relative to an initial distance is achieved. Concurrently, the measurement range of the arrangement is thereby limited as a further increase of the pressure does not lead to a change in the capacity signal anymore, once the two electrodes are in contact with each other.

This problem may be circumvented by a manufacturer of capacitance-based pressure sensors offering a series of differently dimensioned (with respect to lamella thickness and/or cavity width). A user can then choose a suitable sensor for the intended application. It is possible that variations of pressure over a very large range need to be detected by employing several sensors that are each optimized for a subrange. Alternatively, a single sensor may cover the entire range, but at the expense of less sensitivity due to the use of a thicker lamella and/or of a wider cavity.

The problem of a limited measurement range can be solved by arranging the lamella in a tapered relation with respect to the opposing cavity sidewall, instead of in a parallel relation. Alternatively, the lamella may be shaped in a tapered form itself. As a further alternative, a combination of these variants may be used. The provision of a tapered cavity, lamella, or both, leads to an arrangement in which a highly sensitive transduction of the pressure signal can be observed in the first subrange, while in other subranges there remains a sufficient distance between the lamella and an opposite wall, in order to be able to detect a significantly larger pressure value. In other terms, the tapered cavity, gap, and/or lamella may confer a progressive sensitivity to the sensor (measured value small→sensitivity high, and vice versa).

With a deep trench etching process, the dimensions and the shape of the cavities (or etching trenches) and of the lamellae (silicon mesa) can be defined by means of the lithography and the process parameters. For example, an etching trench for a lamella with a wedge-formed lateral cross-section can be obtained by means of lithography. By controlling the etching process, a wedge-formed cross-section in the vertical direction can be created. Furthermore, the etching depth varies with the width of the trench opening and the process parameters. Varying the process parameter during the etching allows for a more or less pronounced effect, so that a further degree of freedom in shaping the cavities and/or the lamellae is available.

According to the teachings disclosed herein, the cavity and/or the lamella of a pressure sensor are arranged such that surfaces that define the plates of a capacitor are not parallel to each other, but exhibit a tapered or wedge-like geometry. The expression "tapered" means that the cavity or the lamella has a varying thickness or width. The variation of the thickness or width is not limited to a linear variation, but may also assume other forms of variations, such as curved or stepped.

Figure 9:
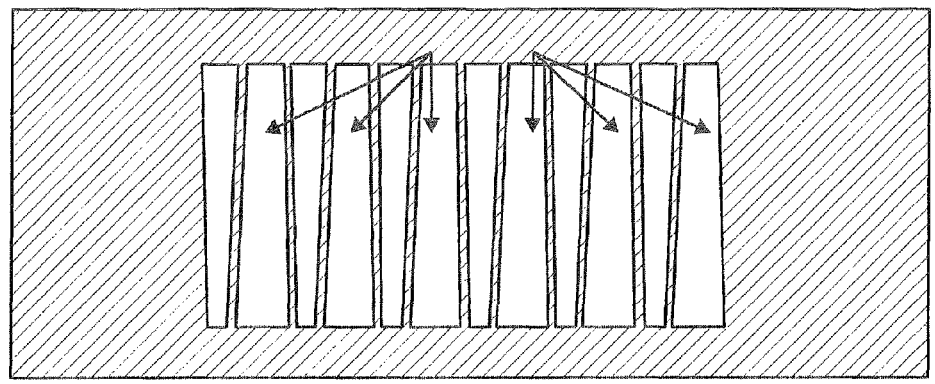
FIG. 9 shows a cross section through a substrate having cavities with tapered cross sections.

FIG. 9 shows a first variation where the lithography mask (not shown) defines a trapezoid cross-section of the cavities. FIG. 9 is a horizontal cross-section through the substrate approximately at the position indicated by VIII-VIII in FIG. 8.

Figure 10:
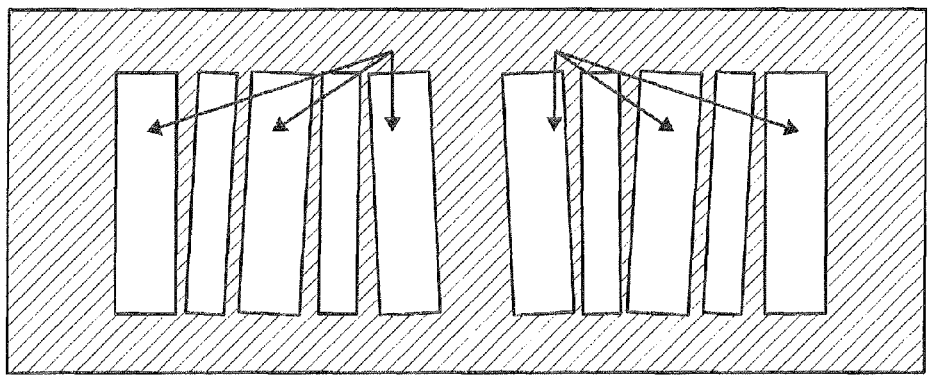
FIG. 10 shows a cross section through a semiconductor structure having cavities and tapered lamellae between the cavities.

FIG. 10 shows another variant in which the lithography mask defines a trapezoid cross-section for the lamella. The arrows in FIGS. 9 and 10 indicate which of the cavities are open to the backside of the second main surface 704 (cf. FIG. 8).

Many further implementations are possible. Not depicted in the drawings is for example an etch depth that varies over the cavity, which may be obtained by combining a lithography from FIG. 9 with an etching process that is strongly influenced by the trench width (shallow regions for narrow trench width, deep etchings for larger trench widths). Furthermore, it is not necessary to increase the widths linearly.

FIGS. 11A to 11D show four stages of a method for providing a semiconductor structure in which some of the cavities are filled with a polysilicon filling according to teachings disclosed herein. As mentioned above with respect to FIG. 8, pressure sensors with a vertical configuration have been developed by some of the inventors. Apart from the configuration shown in FIG. 8, alternative embodiments can make use of a capacitive signal variation for pressure measurement, too. In these alternative embodiments, however, one of the plates of the capacitor is a polysilicon plate and electrically separated from the substrate by means of an oxide. This has the advantage that a functionality of the micromechanical structures can be verified by means of a voltage-dependent capacitance measurement as early as during the production process. The used testing scheme exploits the fact that the polysilicon plate bends due to the applied electrical voltage. Hence, a production control can be ensured by a C(V)-measurement (i.e. capacitance as a function of voltage).

The above mentioned testing scheme cannot be readily employed with, for example, the pressure sensor shown in FIG. 8. A maximal admissible blocking voltage depends, on the one hand, on the doping concentration at the lower edge of the lamella (diode break-through) and is also influenced by the geometry of the trench (defines the channel length; punch). Furthermore, the capacitance of the space charge region (SCR) varies with the applied voltage. With typical structural dimensions, capacitance variations on the order of some picofarads arise as a result of a voltage variation of ten volts. The variation caused by the deflection of the lamella is approximately one order of magnitude smaller. Thus, the above mentioned testing scheme is applicable to the embodiments similar to the structure shown in FIG. 8 with restrictions, only, or even not at all. An inline test by means of a C(V)-measurement would be, however, desirable.

According to teachings disclosed herein, a polysilicon filling is performed in defined trenches subsequent to the trench etching and the application of an auxiliary layer (liner oxide). The polysilicon material is then used as one of the capacitor electrodes, typically the counter electrode, i.e. the other electrode besides the electrode that is formed (or supported) by the lamella. After a polysilicon recess, the oxide can be etched out of the trench in a one-sided manner by means of a lithography step in order to form a cavity between the polysilicon electrode and the lamella. Thus, the testing scheme presented above can be maintained and is suitable for an inline C(V)-measurement.

According to teachings disclosed herein, a poly (silicon) electrode structure within a deep trench is proposed. A cavity is situated between the polysilicon electrode and the adjacent lamella, the cavity defining the distance of the capacitor plates.

Figure 11A:
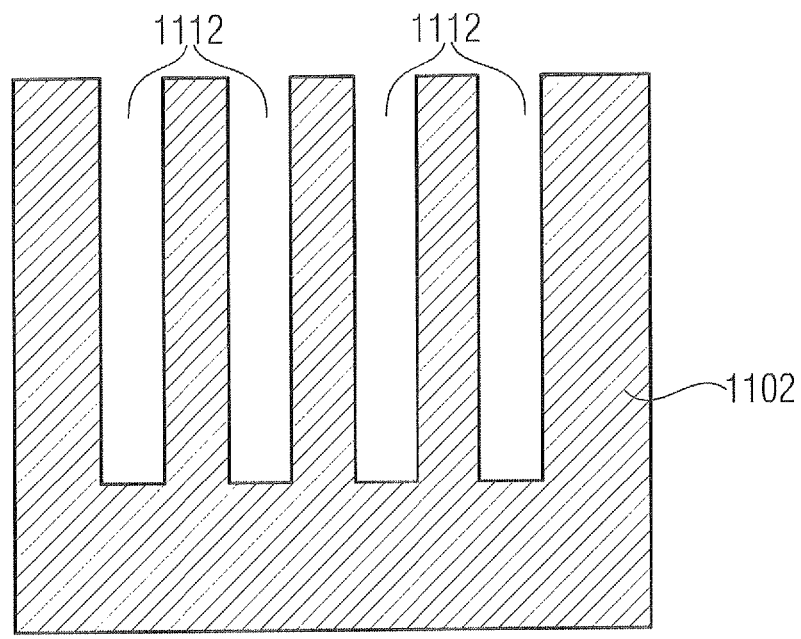
FIGS. 11A to 11D illustrate various stages of an embodiment of a manufacturing process of a semiconductor structure.
Figure 11B:
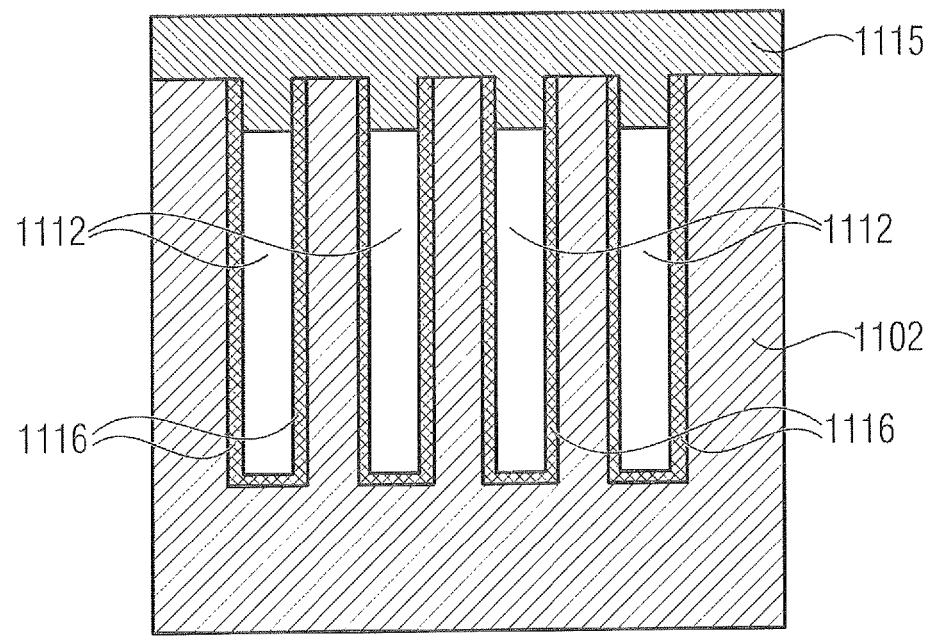
Figure 11C:
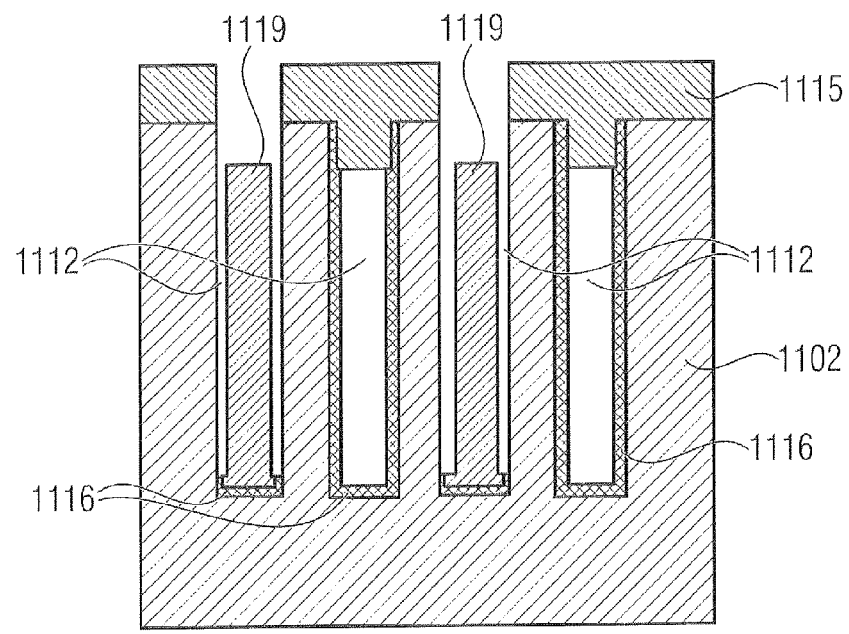
Figure 11D:
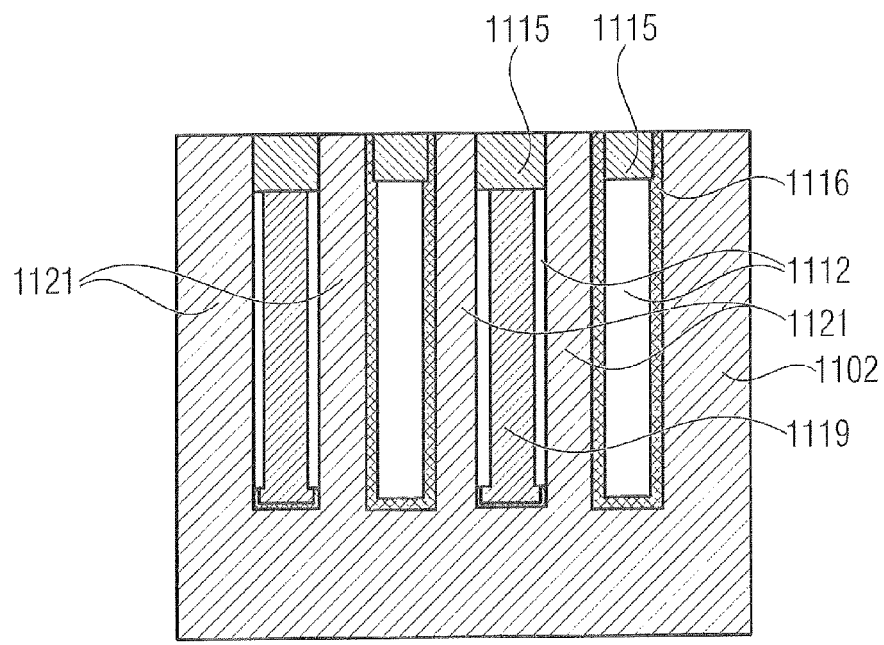

The integration of the proposed concept is conceivable in different forms. FIGS. 11A to 11D show according to one embodiment a first sequence of execution for manufacturing a capacitive pressure sensor with an insulated counter electrode. In FIG. 11A trenches 1112 have been etched into the substrate 1102 using a deep trench etching process. Then an oxide liner 1116 is applied to the interior of the trenches 1112 as can be seen in FIG. 11B. The oxide liner 1116 forms a relatively uniform layer on the inner walls of the trenches 1112 and is used as a sealing material to seal the trenches. FIG. 11B also shows that the trenches 1112 have been closed by a cover material 1115. One of the actions performed subsequent to the stage shown in FIG. 11B is a selective re-opening of some of the trenches 1112. FIG. 11C shows that the first and the third trench were opened e.g. by means of a lithography-based etching process. Once the defined trenches have been re-opened, a polysilicon deposition is performed which results in the creation of a polysilicon structure 1119 in the defined trenches of the plurality of trenches 1112. Then a poly silicon recess is performed to remove the polysilicon deposited on top of the cover material 1115 and also to remove an upper portion of the polysilicon within the trenches 1112. Furthermore, the oxide liner 1116 is etched away from the trenches 1112 down to a certain depth. This leaves the polysilicon structure 1119 substantially free standing, because it is only supported at its bottom (including a small lower portion of the side walls of the polysilicon structure 1119) where the oxide liner 1116 was not etched away. Thus, the polysilicon structure 1119 is surrounded by a circumferential trench and electrically isolated against the substrate 1102, because the oxide liner 1116 typically is an electrically insulating material. By using a circumferential trench around the polysilicon structure, a relatively low parasitic capacitance between the polysilicon structure and the walls of the substrate can be achieved. In the alternative to a complete circumferential trench, it is possible to keep the liner material at the narrow sides of the polysilicon structure to provide some structural stability. FIG. 11C shows the semiconductor structure in an intermediate state in which the oxide liner 1116 has already been etched away. In FIG. 11D it is shown how the defined trenches 1112 are re-closed, using the same material as the cover material 1115 or another suitable material. The cover material 1115 is typically chosen to be electrically insulating so as to avoid an electrical connection between the polysilicon structure 1119 forming the counter electrode and the substrate 1102. Subsequent to the re-closing of the defined trenches 1112, a chemical-mechanical polishing (CMP) step is performed (FIG. 11D). After the state illustrated in FIG. 11D, the second and the fourth trench may be re-opened in order to define pressure channels by which the exterior pressure is conducted to the lamellae 1121. Hence, the trench(es) not filled with the polysilicon form(s) the pressure inlet(s). A measurement signal is picked up as a varying capacitance value between the polysilicon plate(s) and the substrate silicon plates. The basic capacitance can be precisely adjusted via the thickness of the oxide liner 1116.

Figure 12A:
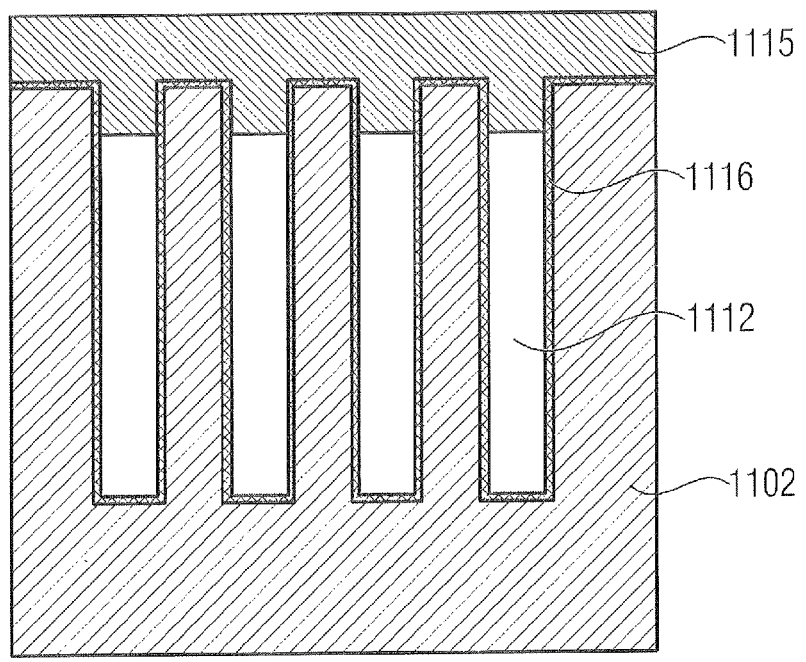
FIGS. 12A to 12D illustrate various stages of another embodiment of a manufacturing process of a semiconductor structure.
Figure 12B:
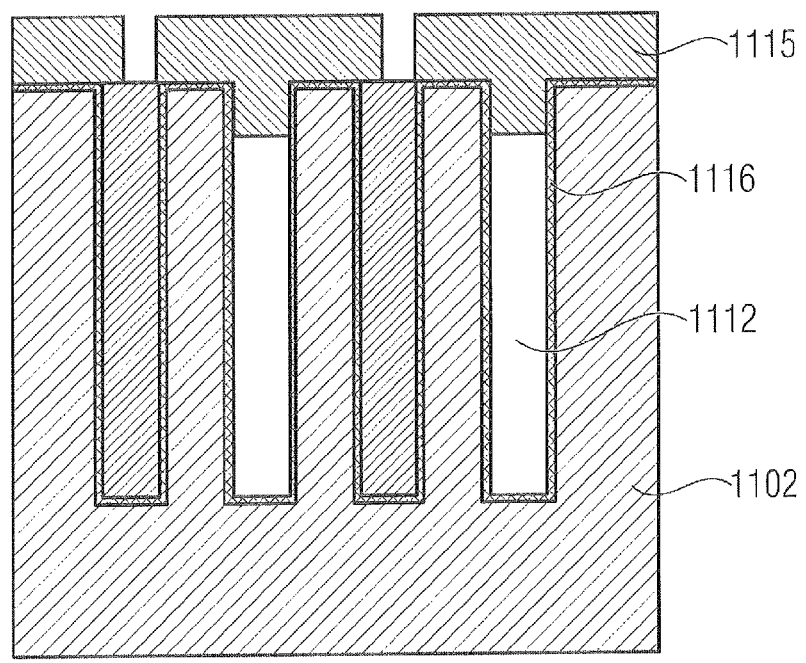
Figure 12C:
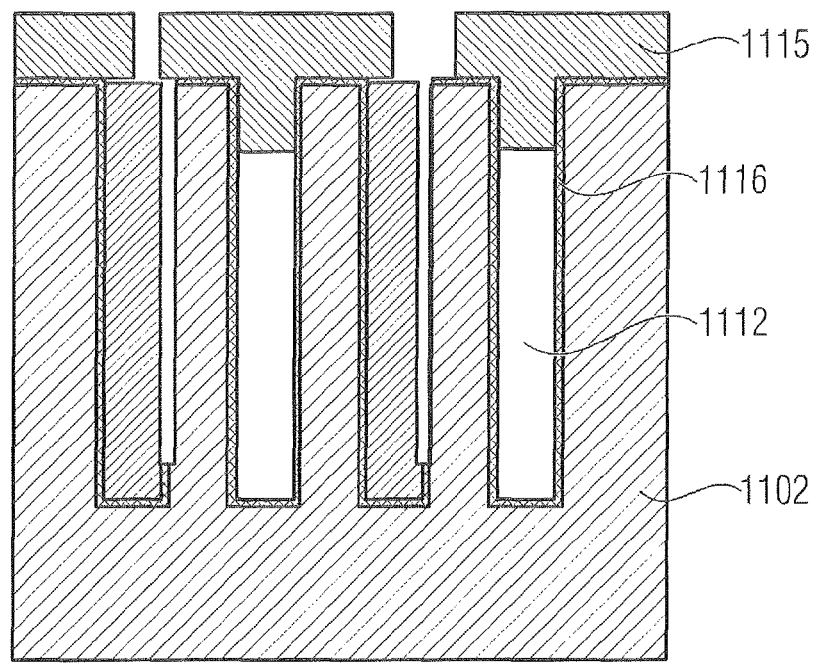

The structure can be created in an alternative manner so that the pressure forces are detected on one side of the polysilicon structure, only. FIGS. 12A to 12D show a possible embodiment of a corresponding process sequence for manufacturing a one-sided capacitive pressure sensor with insulated counter electrode. FIG. 12A basically corresponds to FIG. 11B, that is, the trenches 1112 have been etched, the oxide liner 1116 has been applied to the inner walls of the trenches, and the cover material 1115 has been deposited in order to close the trenches. FIG. 12B shows a state in which the cover material 1115 has been partially removed to expose some of the gaps filled with oxide liner 1116 between the polysilicon structure 1119 and the substrate 1102. The polysilicon recess was also performed prior the state depicted in FIG. 12B. In FIG. 12C the oxide liner 1116 has been etched away within the exposed gaps. In contrast, the oxide liner 1116 has been kept in those gaps that are still covered by the cover material 1115 because the etching agent used for removing the oxide liner 1116 was blocked from accessing those gaps. The etching agent is selected to only dissolve the oxide liner 1116 and leave the cover material and the polysilicon structure 1119 substantially unaffected. A hydrofluoric acid may be used to this end, for example a buffered hydrofluoric acid, a diluted, hydrofluoric acid, or a concentrated hydrofluoric acid. By using a hydrofluoric acid, a good selectivity between silicon and silicon nitride is achieved. Silicon nitride may be used as an etch stop in order to protect surrounding structures.

Figure 12D:
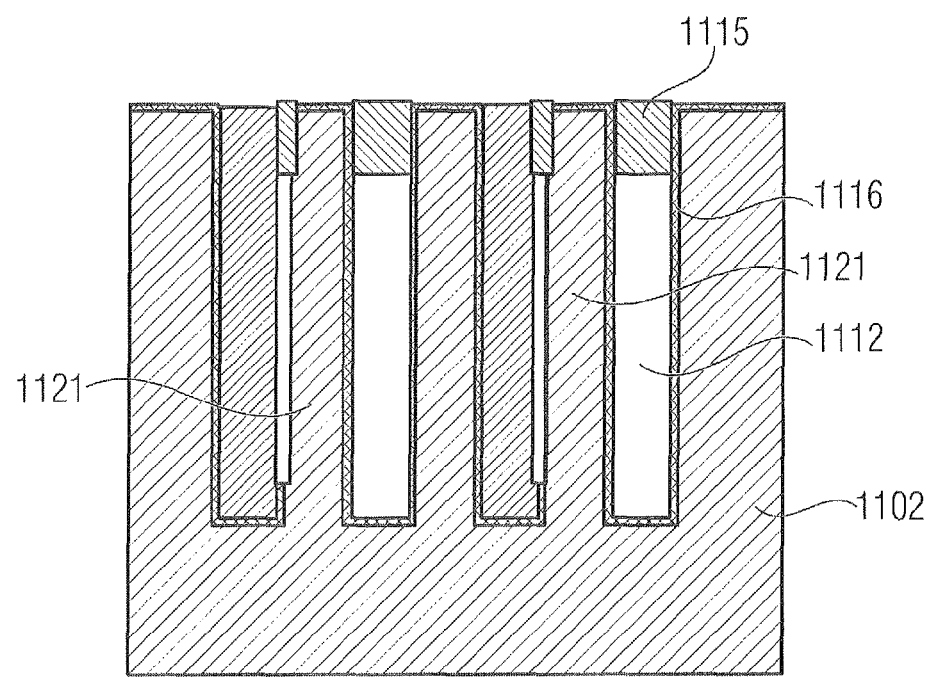

FIG. 12D corresponds by and large to FIG. 11D. In particular, the gaps in which the oxide liner 1116 has been etched away are re-closed again and a chemical-mechanical polishing step has been performed. Thus, a gap has been formed between the polysilicon structures 1119 and the lamellae 1121. As mentioned in the context of FIG. 11D, those trenches not filled with polysilicon between the stages shown in FIGS. 12A and 12B may be re-opened so as to function as pressure channels.

The embodiment shown in FIGS. 12A to 12D may be used in connection with, for example, a pressure sensor in which the lamella(e) is/are located close to an edge of the chip as illustrated in FIGS. 1 to 3. The lamella 1121 is then configured as a boundary lamella or edge lamella. The rightmost of the trenches 1112 may in this case be dimensioned as a singulation trench, that is with a relatively large width and depth.

With the process illustrated in FIGS. 12A to 12D, the stability of the polysilicon structure 1119 is ensured by the one-sided oxide liner 1116 which is not removed and thus supports the polysilicon structure 1119. Accordingly, a sufficient stability can even be obtained if the polysilicon structure 1119 is very thin. Apart from the mentioned liner materials, other auxiliary layers are conceivable (nitride liner in the cavity between polysilicon structure and lamella, etc.).

Figure 13A:
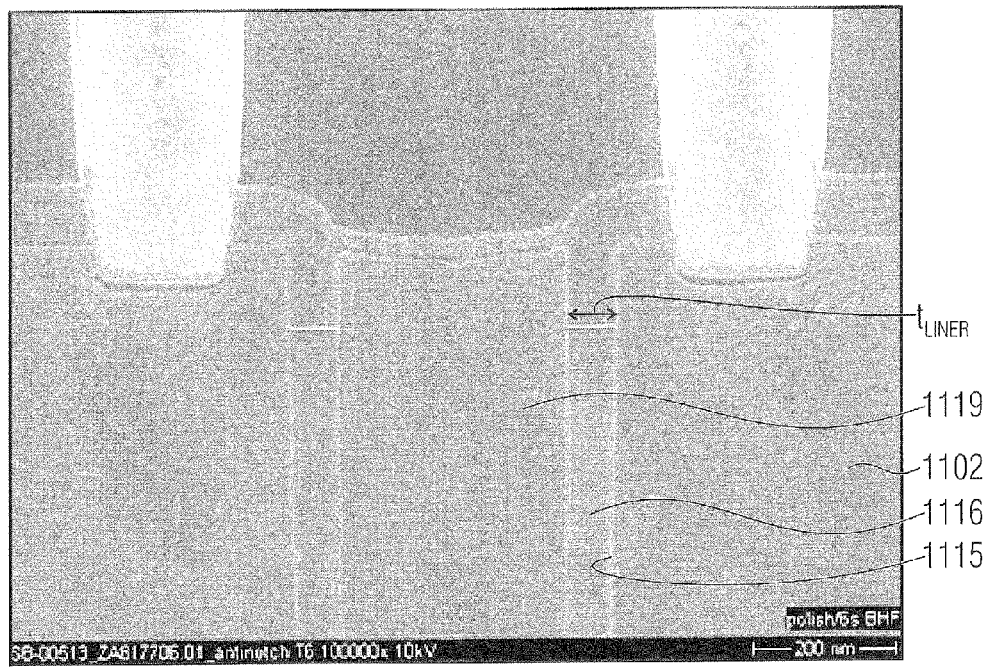
FIG. 13A shows a first scanning electron microscope image of a section of a semiconductor structure obtained at an intermediary step of the manufacturing processes of FIG. 11A-11D or 12A-12D.
Figure 13B:
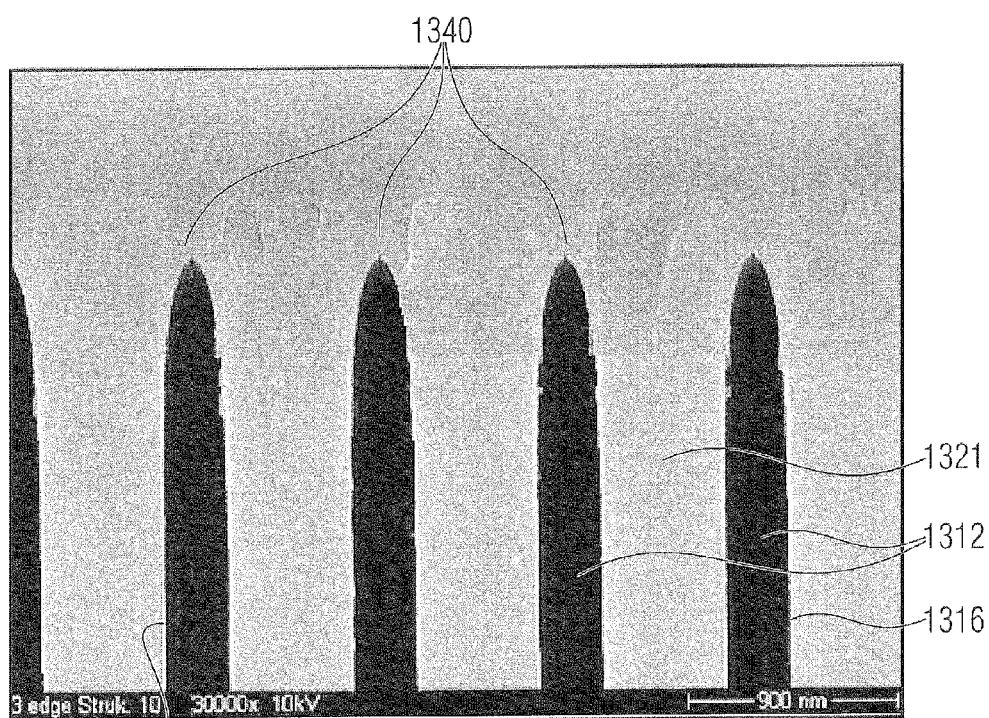
FIG. 13B shows a second scanning electron microscope image of a section of a semiconductor structure obtained at an intermediary step of the manufacturing processes of FIG. 11A-11D or 12A-12D.

To illustrate that the process sequence depicted in FIGS. 11A to 11D and 12A to 12D has been proven and tested, at least partially for some of the process steps, FIGS. 13A and 13B show structural results in the form of scanning electron microscope (SEM) pictures. FIG. 13A shows a trench filled with polysilicon 1119. FIG. 13A shows a state of the process approximately corresponding to the state depicted in FIG. 12B. A precise recess to the top edge of the silicon 1102 has been performed. The oxide liner 1116 has a thickness $t_{LINER}$ of approximately 66 nm, ranging from about 64 nm to 68 nm. The value of 68 nm applies to the layer deposited on top of the substrate 1102. FIG. 13B shows the semiconductor structure after the trenches 1312 have been closed with a trench closure 1340. Hence, FIG. 13B by and large corresponds to FIG. 11B and FIG. 12A. The lamellae 1321 can also be seen in FIG. 13B. The bright borders of the trenches 1312 in FIG. 13B correspond to the oxide liner 1316.

The process sequences proposed in FIGS. 11A to 11D and 12A to 12D are useful when an inline functionality test via a C(V)-measurement shall be performed or when a dependency of the capacitance response on different voltages shall be prevented. The resulting structure is similarly space-saving and only slightly more complex than the earlier methods used to obtain the structure shown in FIG. 8.

Figure 14:
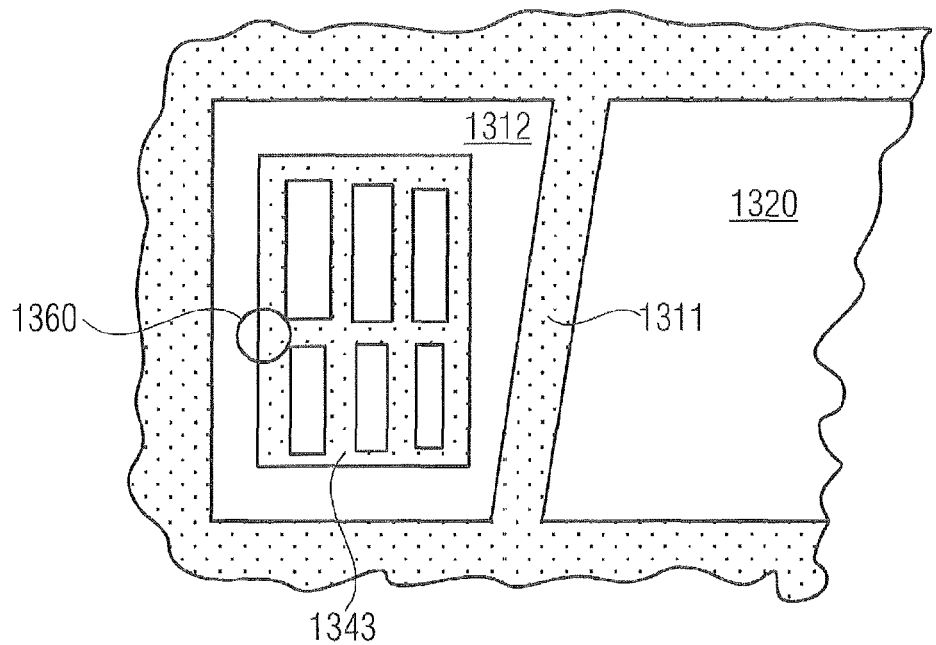
FIG. 14 shows a cross section through a semiconductor substrate in which another combination of some of the disclosed features is implemented.

FIG. 14 shows a combination of a tapered cavity 1312 with an inner structure 1343. The tapered cavity 1312 is separated from a large cavity 1320 by means of a lamella 1311. As mentioned above, the measurement range of e.g. a pressure sensor can be extended by using a tapered cavity. The inner structure 1343 is relatively rigid and an electrical insulation between the inner structure 1343 and the rest of the substrate can be relatively easily accomplished by e.g. the process illustrated in FIGS. 6A to 6D. An electrical connection between the inner structure 1343 and an evaluation circuit (not shown) can be provided, for example, at the position indicated by the circle 1360. In this manner, the electrical connection is sufficiently far away from the lamella 1311 which is arranged to deflect upon pressure variations within the large cavity 1320. The deflection of the lamella 1311 and the proximity of a potential high pressure within the cavity 1320 may induce mechanical stress on the substrate in the vicinity of the lamella 1311 and the cavity 1320. The end of the inner structure 1343 that is opposite to the lamella 1311 is farther away from the site or location where the mechanical stress is induced. Therefore, the electrical connection 1360 is potentially more durable.

Figure 15:
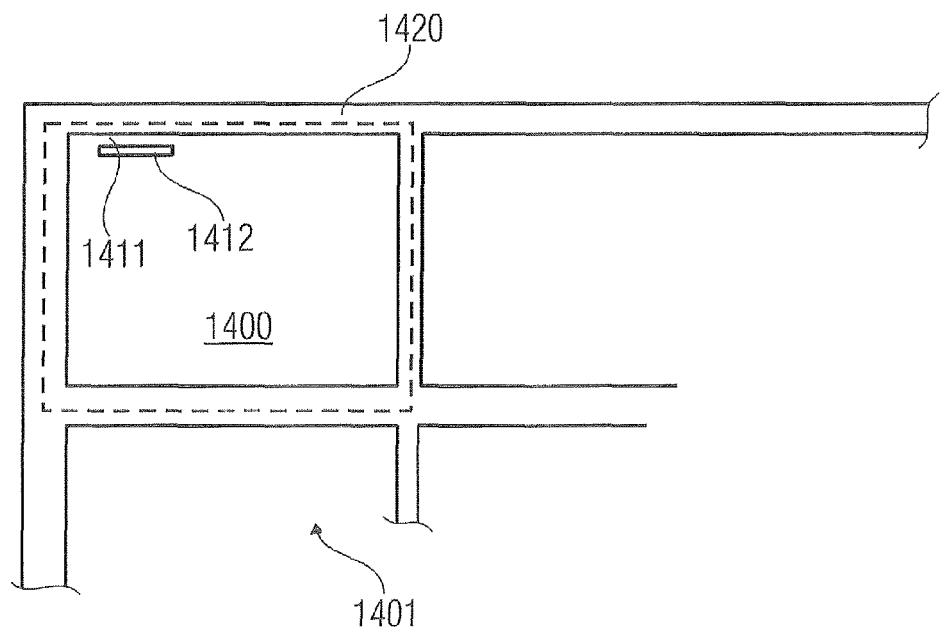
FIG. 15 shows a part of a semiconductor wafer comprising several semiconductor structures prior to a singulation process for obtaining single semiconductor structures.

FIG. 15 illustrates how a semiconductor structure 1400 may be arranged on a wafer 1401. In a schematic manner, the semiconductor structure 1400 comprises a cavity 1412 which may be a closed cavity or an open cavity. The cavity 1412 is positioned close to a chip singulation trench 1420 so that only the lamella 1411 separates the cavity 1412 from the chip singulation trench 1420. Towards the end of a manufacturing process, the semiconductor structure 1400 will be singulated at the chip singulation trench 1420 as indicated by the dashed rectangle. As a result, the cavity 1412 will be close to an edge of the semiconductor structure 1400, e.g. close to a chip edge. Thus, the space around the semiconductor structure 1400 assumes the role of e.g. the pressure channel. No extra cavity to fulfill the role of the pressure channel is required in the case of a pressure sensor. The semiconductor structure 1400 may be mounted so that the chip edge proximal to the cavity 1412 is exposes to the medium of which a pressure is to be measured. The cavity 1412 serves as a reference volume. The cavity 1412 may be open to another side or surface of the semiconductor structure 1400 so that a differential pressure can be measured.

Embodiments provide sensors that are low-cost and integrated on a single chip with logic devices. Embodiments of the sensors are aggregated using CMOS fabrication processes. The sensor cavities and sense elements can be defined for the desired sensitivity and working range.

Although specific embodiments have been illustrated and described herein, it will be appreciated by those of ordinary skill in the art that a variety of ordinate and/or equivalent implementations may be substituted for the specific embodiments shown and described without departing from the scope of the present invention. This application is intended to cover any adaptation or variations of those specific embodiments discussed herein.

The invention claimed is:

1. A method for fabricating a semiconductor structure, the method comprising:
    etching a first opening into a substrate;
    etching a chip singulation trench into the substrate to define a lamella between the first opening and the chip singulation trench;
    fabricating a sense element for sensing a deflection of the lamella; and
    singulating the semiconductor structure at the chip singulation trench.

2. The method according to claim 1, wherein etching the first opening and etching the chip singulation trench is performed concurrently.

3. The method according to claim 1, wherein the first opening comprises a circumferential trench surrounding an inner structure.

4. The method according to claim 3, further comprising:
providing an electrical contact to the inner structure for electrically connecting the inner structure with the sense element.

5. The method according to claim 4, wherein the electrical contact is located at a portion of the inner structure opposite to the chip singulation trench.

6. The method according to claim 1, further comprising, prior to etching the first opening in the substrate:
creating an electrically insulating layer on a main surface of the substrate;
depositing an outer layer of substrate material on the electrically insulating layer;
wherein the etching of the first opening and the chip singulation trench is done from a surface of the outer layer and extends to the electrically insulating layer, at least.

7. The method according to claim 1, further comprising:
applying a liner material to walls of the first opening;
filling the first opening with polysilicon;
etching at least a part of the liner material leaving a gap between the polysilicon and at least part of the walls of the first opening.

8. The method according to claim 1, wherein at least one of the first opening and the lamella has a tapered horizontal cross-section.

9. A method for fabricating a semiconductor structure, the method comprising:
forming a circumferential trench surrounding an inner structure in and near a peripheral edge of a substrate, at least one wall of the circumferential trench facing the peripheral edge defining a lamella;
insulating the inner structure with respect to the substrate at a portion of the inner structure supporting the inner structure at the substrate; and
fabricating a sense element for sensing a deflection on the lamella.

10. The method according to claim 9, further comprising:
providing a connection between the inner structure and the sense element.

11. A method for fabricating a semiconductor structure, the method comprising:
etching a first opening into a substrate;
etching a second opening into the substrate to define a lamella between the first opening and the second opening;
fabricating a sense element for sensing a deflection on the lamella;
closing at least one of the first opening and the second opening;
wherein at least one of the first opening and the lamella has a tapered horizontal cross-section.

12. A method for fabricating a semiconductor structure, the method comprising:
creating an electrically insulating layer at a first main surface of a semiconductor substrate;
providing semiconductor material on the electrically insulating layer;
etching a first opening into the provided semiconductor material and the electrically insulating layer; and
etching a second opening into the provided semiconductor material and the electrically insulating layer to define a deflectable lamella in the semiconductor material between the first opening and the second opening.

13. The method according to claim 12, further comprising:
fabricating a sense element for sensing a deflection of the deflectable lamella.

* * * * *